(12) United States Patent
Van Gorkom et al.

(10) Patent No.: US 7,883,238 B2
(45) Date of Patent: Feb. 8, 2011

(54) LIGHT COLLIMATION AND MIXING OF REMOTE LIGHT SOURCES

(75) Inventors: Ramon Pascal Van Gorkom, Eindhoven (NL); Michel Cornelis Josephus Marie Vissenberg, Eindhoven (NL); Marcellinus Petrus Carolus Michael Krijn, Eindhoven (NL); Peter Alexander Duine, Eindhoven (NL)

(73) Assignee: Koninklijke Philips Electronics N.V., Eindhoven (NL)

( * ) Notice: Subject to any disclaimer, the term of this patent is extended or adjusted under 35 U.S.C. 154(b) by 232 days.

(21) Appl. No.: 12/302,896

(22) PCT Filed: Jun. 6, 2007

(86) PCT No.: PCT/IB2007/052121

§ 371 (c)(1),
(2), (4) Date: Dec. 1, 2008

(87) PCT Pub. No.: WO2007/144805

PCT Pub. Date: Dec. 21, 2007

(65) Prior Publication Data

US 2009/0268460 A1    Oct. 29, 2009

(30) Foreign Application Priority Data

Jun. 16, 2006    (EP) .................................. 06115570

(51) Int. Cl.
*F21V 5/00*        (2006.01)
*G02B 27/30*    (2006.01)
(52) U.S. Cl. .................... 362/231; 362/331; 362/311.12
(58) Field of Classification Search ................. 362/231, 362/235, 331, 612, 249.02, 311.12
See application file for complete search history.

(56) References Cited

U.S. PATENT DOCUMENTS

| 5,155,628 | A  | * | 10/1992 | Dosmann ..................... 359/640 |
| 5,808,803 | A  | * | 9/1998  | Ullmann et al. ............. 359/641 |
| 5,914,817 | A  | * | 6/1999  | Browning et al. ........... 359/634 |
| 6,350,041 | B1 |   | 2/2002  | Tarsa et al. |
| 7,144,121 | B2 | * | 12/2006 | Minano et al. ................ 353/94 |
| 7,154,673 | B2 | * | 12/2006 | Tsukihara et al. ........... 359/618 |
| 7,186,004 | B2 | * | 3/2007  | Powell et al. ............... 362/244 |
| 7,210,815 | B2 | * | 5/2007  | Imade ........................ 362/234 |
| 2001/0001241 | A1 |   | 5/2001 | Kawakami et al. |
| 2004/0218390 | A1 |   | 11/2004 | Holman et al. |

FOREIGN PATENT DOCUMENTS

| DE | 102005031336 A1 | 11/2006 |
| EP | 1235281 A1 | 8/2002 |
| TW | 220322 | 8/2004 |
| WO | 2004068182 A2 | 8/2004 |
| WO | 2005083318 A1 | 9/2005 |
| WO | 2007069198 A2 | 6/2007 |

\* cited by examiner

*Primary Examiner*—Stephen F. Husar
*Assistant Examiner*—Peggy A. Neils

(57) ABSTRACT

A light-emitting device, comprising at least a first light source (101) and a second light source (102) is provided. The light source further comprises a first collimating means (111) for collimating light from the first light-source and a second collimating means (112) for collimating light from said second light source wherein the output areas of the collimating means at least partly overlaps. A light guiding means (107) is arranged between said light sources and said collimating means for guiding light from the first light source to the first light collimating means, and from the second light source to the second collimating means. A light-emitting device of the present invention can provide well mixed and collimated light even though there is a distance between the light sources and the collimating means.

12 Claims, 3 Drawing Sheets

LIGHT COLLIMATION AND MIXING OF REMOTE LIGHT SOURCES

This application is a national stage application under 35 U.S.C. §371 of International Application No. PCT/IB2007/052121 filed on Jun. 6, 2007, and published in the English language on Dec. 21, 2007, as International Publication No. WO/2007/144805, which claims priority to European Application No. 06115570.1, filed on Jun. 16, 2006, incorporated herein by reference.

The present invention relates to a light-emitting device, comprising at least a first light source for emitting light of a first light property and a second light source for emitting light of a second light property, said first light property being different from said second light property, a first collimating means for collimating light of said first light property, comprising at least a first receiving area and at least a first output area being larger than said first receiving area and a second collimating means for emitting light of said second light property, comprising at least a second receiving area and at least a second output area being larger than said second receiving area, wherein the output area of said first collimating means and the output area of said second collimating means at least partly overlaps.

Planar light sources are currently considered for several different applications, such as lamps for environmental illumination, backlights in liquid crystal displays and light sources in projection displays.

Light emitting diodes, LEDs, may be a desirable choice of light sources in many applications, for example as the life time of LEDs are higher than the life time of incandescent bulbs, fluorescent bulbs and discharge lamps.

Further, light emitting diodes are more power consumption efficient than incandescent bulbs and are expected to be more efficient than fluorescent tubes in a near future.

In several of these and other applications, it is often desired to achieve light of high brightness and color variability.

The brightness (B) is defined as being the amount of lumens ($\Phi$) emitted per unit of area (A) and per unit of solid angle ($\Omega$):

$$B = \frac{\Phi}{A\Omega}.$$

Conventionally, color variability is obtained by arranging independently a number of red, green, and blue LEDs in an array (rows, columns or a two-dimensional matrix) to form an array of color variable, independently addressable, pixels.

Color variable light of high brightness is typically obtained by stacking a number of high-brightness LEDs, emitting in different parts of the spectrum, side by side in a matrix. The more LEDs being arranged on a certain area, the higher the ratio $\Phi/A$ becomes.

However, positioning LEDs that emit different colors side by side in itself is not an efficient way of obtaining light that is collimated as much as possible. Typically, LEDs emits light in an essentially Lambertian pattern, i.e. having an intensity proportional to the cosine of the angle from which it is viewed. Positioning LEDs of different colors side by side will again result in a Lambertian radiation pattern. Thus, the angular spread, proportional to $\Omega$, is unchanged, as is the brightness (according to the formula above).

A directed beam can be formed from this by reducing the angular spread. This is for example described in US patent application 2004/0218390, where the array of LEDs is arranged in a corresponding array of tapered metallic reflecting bins. However, this does not increase the brightness because the LEDs have to be placed further apart to make room for the collimators. In fact, the brightness is almost the same because the decrease in angular spread is compensated by the increase in area.

Another problem is that for individual light collimation, LEDs need to be located very near or even in the collimating structure for high efficiency.

As mentioned above, LEDs typically emit light in a Lambertian pattern, and if the LED-specific receiving area of the collimating structure is located to far away from the LED, it needs to be very big in order to be able to collect the major part of the light emitted by the LED.

Thus, the collimating structure proposed in US patent application 2004/0218390 is not suitable for LED-specific light collimation in the case of multi-LED packages, where several LEDs, for example a red, a green and a blue LED, representing a color-variable pixel, are encapsulated by a common encapsulation. The encapsulation automatically forces the collimating structure to be located at a significant distance from the LEDs, and the collimating structure will not be able to perform high efficient LED-specific collimation.

It is an object of the present invention to overcome this problem, and to provide a compact light emitting device comprising a plurality of light sources and a light collimating and mixing structure, which device is capable of emitting well collimated and mixed light of high brightness, even if the collimating and mixing structure is located distant from the light sources.

The present inventors have found that the above objects may be achieved by providing a light-emitting device according to the present invention.

Thus, in a first aspect the present invention relates to a light-emitting device, comprising at least a first light source for omitting light of a first light property and a second light source for emitting light of a second light property, said first light property being different from said second light property; a first collimating means for collimating light of said first light property, comprising at least a first receiving area and at least a first output area being larger than said first receiving area; a second collimating means for emitting light of said second light property, comprising at least a second receiving area and at least a second output area being larger than said second receiving area, wherein the output area of said first collimating means and the output area of said second collimating means at least partly overlaps; and a light guiding means for guiding light from said first light source to said at least one receiving area of said first light collimating means, and guiding light from said second light source to said at least one receiving area of said second light collimating means. The first collimating means collimates light emanating from the first light source while leaving the light emanating from the second light source essentially unaffected, and the second collimating means collimates light emanating from the second light source while leaving the light emanating from the first light source essentially unaffected. Thus, light from different light-sources may be independently collimated.

The output area of the first collimating means overlaps at least partly with the output area of the second collimating means, and thus, light emanating from the first light source and being collimated will become well mixed with light emanating from the second light source and being collimated.

The overlapping output areas allow for an increase in brightness. Taking the above-mentioned brightness-formula, it will be able to decrease the area (A) compared to a conventional collimator, where the output areas are located side by side. Further, a good light mixing is obtained due to that the output areas overlap.

The light guiding means is arranged to ensure that light from a specific light source is received by the correct receiving area. When the collimating structure is arranged at a distance from the light sources, the light from the light sources will spread over a large area. To be able to collimate a major part of this light, a collimator having a large receiving area would be needed. However, a large receiving area would be detrimental to the brightness of the light.

By using a light guiding means between the collimating structure and the light sources, the distance between them is not that relevant, since the light guiding means directs the light from each light source to the correct receiving area, forming "virtual light sources" at the receiving areas of the collimating means.

Thus, it will be possible to obtain well-collimated light of high brightness even when the collimating structure is arranged at some distance from the light sources, as may be the case when the light sources are encapsulated, and the collimating structure must be located outside the encapsulation.

In embodiments of the present invention, the light guiding means may comprise at least one lens (a single lens or a system of lenses) arranged between the light sources and the collimating means. The lens(es) are arranged to receive light from the light sources and to focus light from the first light source onto at least one receiving area of a collimating means adapted for collimating light from the first light source, and to focus light from the second light source onto a receiving area of a collimating means adapted for collimating light from the second light source.

The use of lenses as light guiding means provides a simple structure for guiding the light of each light source to the correct collimator.

In preferred embodiments of the present invention, the lens or lens system used as or comprised in the light guiding means is a telecentric lens or lens system.

One advantage of using telecentric lenses or lens systems is that the angular distribution of the rays can be conserved in the "virtual light source", i.e. the light entering the collimator has the same angular distribution as the light originally emitted by the light source, in case the image is not magnified or demagnified.

In embodiments of the present invention, the light guiding means may comprise at least a first optical wave guide for guiding light from the first light source to a receiving area of a first light collimating means, adapted for collimating light from the first light source, and at least a second optical wave guide for guiding light from the second light source to a receiving area of a second light collimating means, adapted for collimating light from the second light source.

An advantage of using an optical wave guide is that it allows the distance between the light source and the collimating structure to be large, and allows the light source and the collimating structure to be staggered. Examples of such optical wave guides include, but are not limited to optical fibers.

In embodiments of the present invention, the light guiding means may comprise a mirror or a system of mirrors for guiding at light from the first light source to the receiving area of a first light collimating means, adapted for collimating light from the first light source, and for guiding light from the second light source to said at least one receiving area of said second light collimating means, adapted for collimating light from said second light source.

One advantage of using mirrors in the light guiding means is that chromatic aberrations may be avoided and that ghost images, such as may appear due to reflections from e.g. lens surfaces, also may be avoided.

In preferred embodiments of the present invention, the first light collimating means comprises sidewalls at least partly connecting its receiving area to its output area, and least part of the sidewalls of the first collimating means comprises a first filter for reflecting light of the first light property. Likewise, the second light collimating means comprises sidewalls at least partly connecting its receiving area to its output area, and at least part of the sidewalls of the second collimating means comprises a second filter for reflecting light of the first light property.

The first filter is adapted to reflect light of the first light property and to transmit light of the second light property, while the second filter is adapted to reflect light of the second light property and to transmit light of the second light property.

The sidewalls of the collimating means may be formed by freestanding self-supporting wall elements, such as of glass or plastic. The filters of the collimators may constitute, or may be arranged on, said wall elements. The dichroic material on the different sides of the wall element may be the same or different, in order to obtain good filtering properties.

Alternatively, the sidewalls of the collimators are formed by joint surfaces between two adjacent solid wave guides, such as for example prisms, where the filters may be arranged on such joint surface between two wave guides.

Alternatively, the sidewalls of the collimators may be an interface between a solid wave guide and the atmosphere, where the filters may be arranged on the face of the wave guide forming this interface.

One advantage of such an arrangement is that the first collimating means and the second collimating means may act essentially independent of each other, even though the output areas of the two collimating means overlap. This allows for collimation and light mixing in the same structure, instead of performing the collimation in one structure and thereafter performing the light mixing in another structure (or vice versa).

In embodiments of the present invention, the first light property is a first wavelength interval and the first filter is a first dichroic filter, and the second light property is a second wavelength interval and the second filter is a second dichroic filter.

In alternative embodiments, the first light property is a first polarization state and the first filter is a first polarization filter, and the second light property is a second polarization state and the second filter is a second polarization filter.

In preferred embodiments of the present invention, each of the first and the second light source comprises at least one light emitting diode (LED). The invention is especially well suited for LEDs. Even though LEDs in general emit light in a Lambertian pattern (half sphere emission), the light from LEDs may be collimated in the present invention.

In preferred embodiments of the present invention, the light guiding means projects a first optical image of the first light source on a receiving area of the first light collimating means, and the area of this first optical image is smaller than the area of the first light source. Likewise, the light guiding means projects a second optical image of the second light source on a receiving area of the second light collimating means, and the area of this second optical image may be smaller than the area of the second light source.

By using a light guiding means that demagnifies the area of light, for example by placing the lens further away from the LEDs, the virtual image of the light source can be made smaller than the actual light source. This allows efficient collimation and light mixing from a collimating structure where the receiving areas of the collimators are smaller than the light source. Smaller receiving areas allow for collimating structures with a lower height, and thus the total height of the device may be made lower. Demagnification can be done without loss of light if the light from the LEDs is already somewhat collimated. However, if this is not the case then some light is lost. However, this can still be attractive if we want to keep the structure as small as possible.

Accordingly, in preferred embodiments, the receiving area of the first light collimating means may be smaller than the area of the first light source and/or wherein the receiving area of the second light collimating means may be smaller than the area of the second light source.

This and other aspects of the present invention will now be described in more detail, with reference to the appended drawings showing currently preferred embodiment of the invention.

FIG. 1b illustrates schematically a variant of the embodiment in FIG. 1a.

Figure 1A:
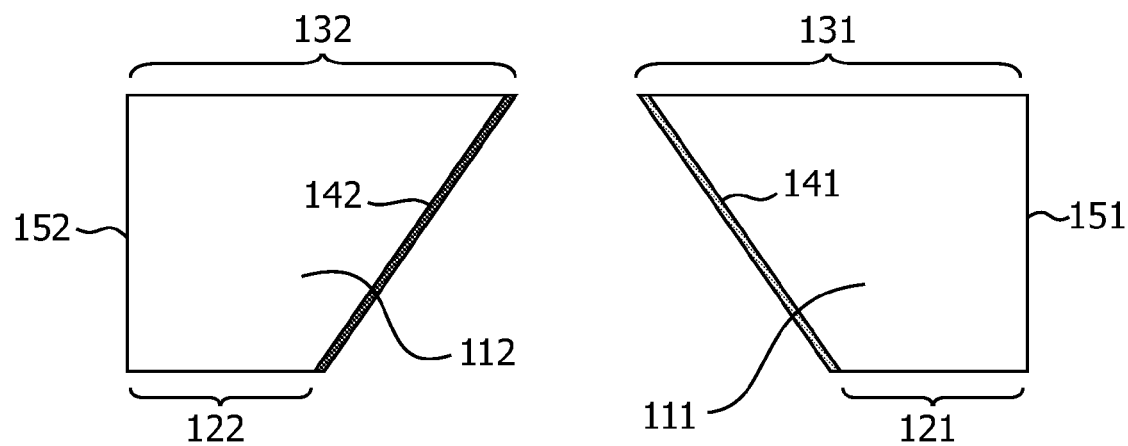
FIG. 1a illustrates schematically a first embodiment of a light-emitting device of the present invention.

The present invention relates to a light-emitting device comprising a plurality of light sources and collimating means for collimating and mixing the light from the light sources, wherein light guiding means are arranged between the light sources and the collimating means.

As used herein, the term "light source" relates to any kind of light source known to those skilled in the art. For example, the term relates to incandescent bulbs, discharge lamps and light emitting diodes.

As used herein, "light-emitting diodes" relates to all different types of light emitting diodes (LEDs), including organic based LEDs, polymeric based LEDs and inorganic based LEDs, which in operating mode emits light of any wavelength or wavelength interval, from ultra violet to infrared. Light emitting diodes, in the context of this application, are also taken to encompass laser diodes, i.e. light emitting diodes emitting laser light. Light emitting diodes suitable for use in the present invention include, but are not limited to, top-emissive, side-emissive and bottom-emissive light emitting diodes.

As used herein, the term "organic light-emitting diodes" or "OLEDs" relates to all different types of light emitting diodes (LEDs) comprising an organic light-emitting material, including small organic molecule based LEDs (smOLEDs) and organic polymer based LEDs (polyLED), which in operating mode emits light of any wavelength or wavelength interval, from ultra violet to infrared. Also transparent top-emissive, bottom-emissive or both top- and bottom-emissive OLEDs (TOLEDs), may be used as light sources in the present invention.

As used herein, the color of a light emitting diode, e.g. a "green light emitting diode", refers to the color, i.e. the wavelength range of the light emitted by the light emitting diode in operational mode.

As mentioned above, the inventive idea of the present invention also reaches out to the mixing and collimation of different polarization properties. Thus, in appropriate passages of the description herein, the term "wavelength interval" may be substituted by "polarization state", "dichroic filter" may be substituted by "polarization filter" and "color" may be substituted by "polarization".

As used herein, the term "collimator" and related terms, such as "collimating means" refers to an element that is capable of receiving electromagnetic (EM) radiation, e.g. light in the interval from UV to IR, and reduce the collimation angle of the received EM-radiation.

As used herein, the term "dichroic filter" relates to a filter that reflects electromagnetic radiation of one or more wavelengths or wavelength ranges, and transmits wavelengths or wavelength ranges, while maintaining a low, typically nearly zero, coefficient of absorption for all wavelengths of interest.

A dichroic filter may be of high-pass, low-pass, band-pass or band rejection type.

Dichroic filters suitable for use in a brightness enhancing means of the present invention include dichroic filters known to those skilled in the art, and include a multilayer of materials that differ in the index of refraction.

One example of such dichroic filters, commonly known as "interference stacks" comprise alternating layers of $Ta_2O_5$ and $SiO_2$. The thickness of each layer is typically approximately equal to a quarter of the wavelength in air divided with the index of refraction, where the wavelength in air equals the dominant wavelength of the light for which the dichroic filter is adapted.

Other examples of dichroic filters known to those skilled in the art and suitable for use in the present invention are such filters based on cholesteric liquid crystals, so called photonic crystals or holographic layers.

As used in the context of the present invention, a dichroic filter is matched to a lighting unit if the dichroic filter reflects wavelengths in the wavelength range emitted by the lighting unit while transmitting light of a different wavelength range.

For example, a dichroic filter adapted for green light may reflect green light while transmitting blue and red light.

It is not necessary that the emitted wavelength range and the reflected wavelength range are identical. The reflected wavelength range may for example be narrower than the emitted wavelength range, or may be broader than the emitted wavelength range.

Further, the dichroic filters may be non-ideal, i.e. not reflecting 100% of the light in the wavelength range in which the filter is to reflect light. Thus, the term "dichroic filter arranged to reflect light in a wavelength interval" is to be taken as "dichroic filter arranged to at least partially reflect light in a wavelength interval".

For example, a dichroic filter may be matched to lighting units of two different colors, for example red and green, transmitting blue light, etc.

As used herein, the term "wavelength range" refers to both continuous and discontinuous wavelength ranges.

As used herein, the term "lens" relates to a single lens as well as to systems of a plurality of lenses, which together effectively acts as a lens.

A first exemplary embodiment of the present invention, as is schematically illustrated in FIG. 1a, relates to a light emitting device 100 comprising a first LED 101 and a second LED 102 arranged on a substrate 103 and encapsulated by a common encapsulation layer 104. For illustrative purposes, the first LED 101 may be assumed to emit red light and the second LED may be assumed to emit green light. However, the red and the green light in this embodiment may in fact represent any arbitrary wavelength range or polarization state.

A collimating structure 110 is arranged on top of the LEDs, comprising a first collimator 111, which is capable of collimating the light emitted by the first LED 101, and a second collimator 112, which is capable of collimating the light emitted by the second LED 102.

The first collimator 111 has an receiving area 121 for receiving at least part of the light emitted by the first LED 101, and an output area 131, through which the received light exits the light emitting device.

The first collimator 111 further comprises sidewalls 141 and 151, which are capable of reflecting light emitted by the first LED 101.

The slanted sidewall 141 of the first collimator 111 comprises a reflecting filter, which reflects light emitted by the first LED 101 and transmits light emitted by the second LED 102.

The sidewall 151 should reflect the light emitted by the first LED 101, and may thus comprise the same or a similar type of selectively reflective filter as that of the slanted sidewall 141, but may in this embodiment alternatively be a surface that reflects essentially all light incident on that sidewall.

The second collimator 112 further comprises sidewalls 142 and 152, which are capable of reflecting light emitted by the second LED 102.

The slanted sidewall 142 of the second collimator 112 comprises a reflecting filter, which reflects light emitted by the second LED 102 and transmits light emitted by the first LED 101.

The sidewall 152 should reflect the light emitted by the second LED 102, and may thus comprise the same or a similar type of selectively reflective filter as that of the slanted sidewall 141, but may in this embodiment alternatively be a surface that reflects essentially all light incident on that sidewall.

The slanted sidewalls 141 and 142 together form a V-shaped profile element where the edge of the V-shaped element is arranged towards the substrate 103. The edge forms the borderline between the receiving area 121 of the first collimator 111 and the receiving area 122 of the second collimator 112.

The slanted sidewalls 141 and 142 each form a leg of the V-shaped profile element.

The slanted sidewall 141 is located in the beam path from the receiving area 122 to the output area 132 of the second collimator 112, and should thus have a high transmission for the light meant to enter the receiving area 122 of the second collimator 112, i.e. the light from the second LED 102. Analogously, the slanted sidewall 142 is located in the beam path from the receiving area 121 to the output area 131 of the first collimator 111, and should thus have a high transmission for the light meant to enter the receiving area 121 of the first collimator 111, i.e. the light from the first LED 101.

In the case mentioned above, where the first LED 101 emits red light, the filter arranged on the slanted sidewall 141, and optionally on the sidewall 151 is a dichroic filter adapted for reflection of red light and transmission of green light. Consequently, the filter arranged on the slanted sidewall 142, and optionally on the sidewall 152, is a dichroic filter adapted for reflection of green light and transmission of red light.

In an alternative embodiment, the first LED 101 may emit light having a first polarization, e.g. a first linear polarization on one axis, and the second LED 102 may emit light having a second polarization, e.g. second linear polarized along the axis perpendicular to the first axis. In that case, the filters arranged on the slanted sidewall 141, and optionally on the sidewall 151 is a polarization filter adapted for reflection of the first linear polarization light and transmission of the second linear polarization. Consequently, the filter arranged on the slanted sidewall 142, and optionally on the sidewall 152 is a polarization filter adapted for reflection of the second polarization and transmission of the first polarization.

A lens 107 is arranged in the path of light from the LEDs 101, 102 to the collimating structure 110, and outside the encapsulation layer 104.

The lens 107 is arranged such that at least a major part of the light emitted by the first LED 101 and received by the lens 107 is projected by the lens to the receiving area 121 of the first collimator 111, to form a first "virtual light source" at the receiving area 121. Further, the lens 107 is arranged such that at least a major part of the light emitted by the second LED 102 and received by the lens 107 is projected by the lens to the receiving area 122 of the second collimator 112, to form a second "virtual light source" on the receiving area 122.

In the embodiment shown in FIG. 1a, reflecting walls 106 are arranged at the sides of the encapsulation 104 as a jacket extending from the substrate 103 to the light collimating structure 110. This is to ensure that light emitted from the LEDs 101 and 102 at oblique angles may be received by the lens 107. In embodiments of the present invention, this jacket extends from the substrate to the output areas of the collimators, such that the side walls 151 and 152 forms part of this jacket.

In the embodiment shown in FIG. 1a, the reflecting walls 106 are arranged parallel to each other and perpendicular to the substrate 103, i.e. forming an essentially cylindrical reflective jacket. However, such reflecting walls could be arranged non-parallel, for example forming a tapered funnel-like jacket being more narrow towards the substrate 103 and more wide towards the light collimating structure 110.

In the embodiment shown in FIG. 1a, each LED-package comprises two LEDs 101 and 102. As will be realized by those skilled in the art, the above embodiment is not limited to this, but may be modified such that the LED-package may comprise more than two, such as three LEDs, each LED emitting light of a distinct color (wavelength range) and wherein the light collimating structure comprises at least one for each LED in the LED-package and wherein a light-guiding means is arranged to guide the light from each LED into the receiving area of the corresponding collimator.

Figure 1A:
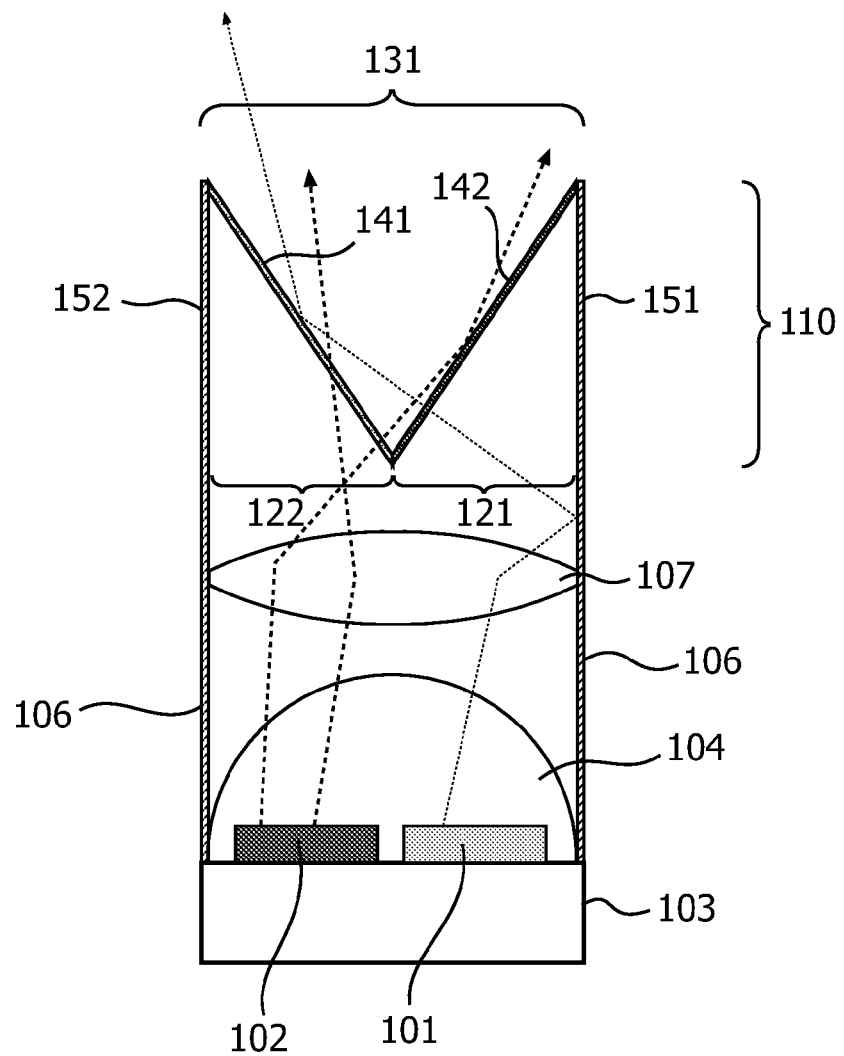
Figure 1B:
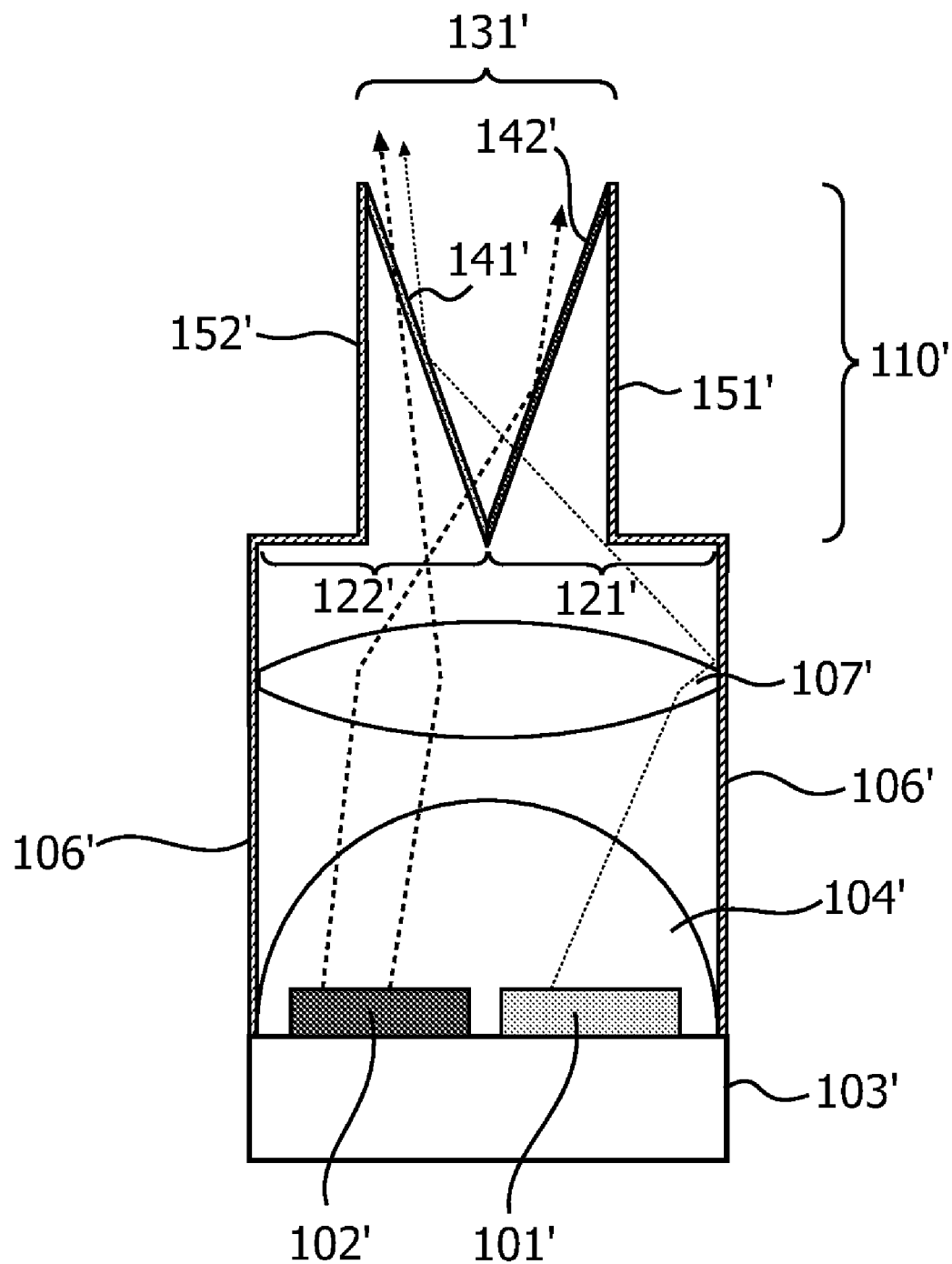
Figure 2:
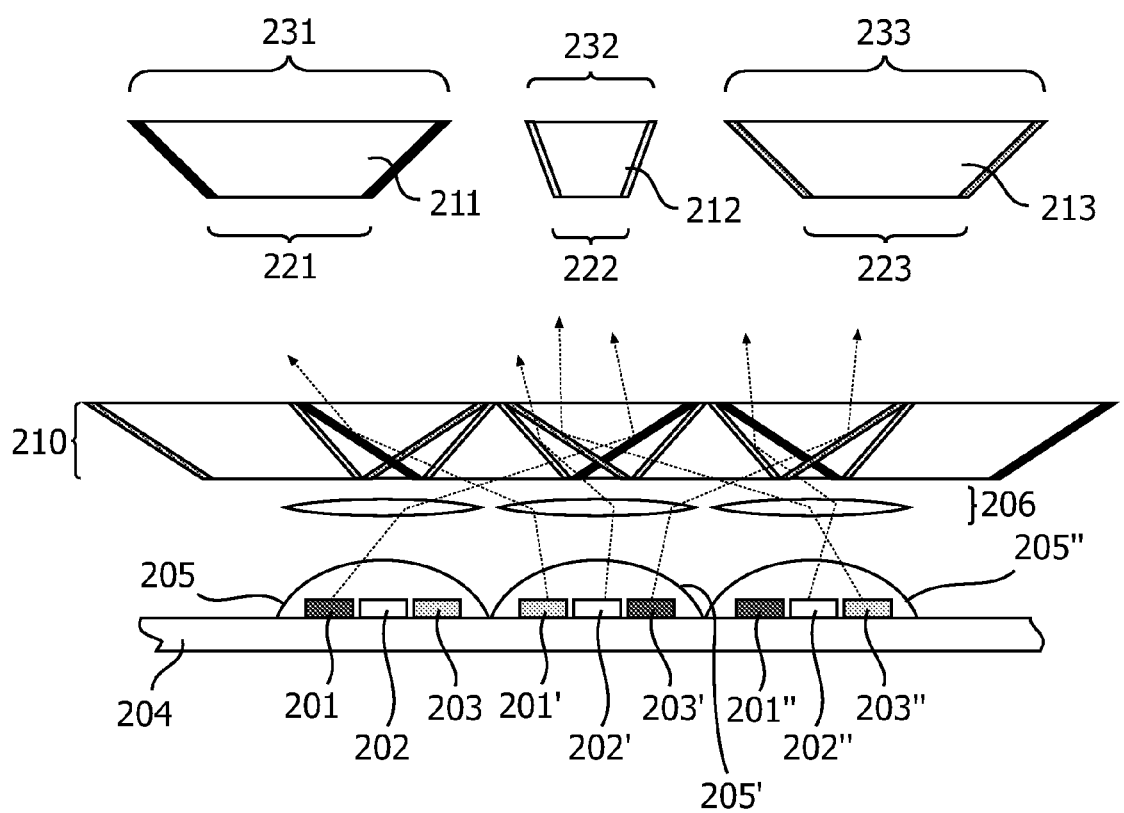
FIG. 2 shows a second embodiment of a light-emitting device of the present invention.

In a variant to the embodiment illustrated in FIG. 1a, the variant being illustrated in FIG. 1b, the width of the collimating structure 110' is less than the width of the LED-package, and the receiving areas of the collimators are smaller than the area of the corresponding LEDs. In this embodiment, this is achieved using a lens 107' which projects an optical image of each LED, where the optical image ("virtual light source") has a smaller area than the corresponding LED. Because of the smaller receiving areas needed for each collimator, the width of the collimating structure 110' may be made reduced. Further, as the receiving areas are made smaller, the height of the collimating structure can be made lower, while maintaining the desired degree of collimation, alternatively obtaining a higher degree of collimation while maintaining the height of the collimating structure. An embodiment of a light-emitting device of the present invention adapted for providing collimated and well mixed light from LED packages comprising three different LEDs is schematically illustrated in FIG. 2.

In this embodiment, an array of LED packages 205, 205', 205" are arranged on a substrate. Each LED-package 205, 205', 205" comprises a first LED 201, 201', 201" emitting light of a first property, a second LED 202, 202', 202" emitting light of a second property and a third LED 203, 203', 203" emitting light of a third property. As is discussed above, these properties may for example represent a first, a second and a third wavelength range (color) or polarization state.

On top of the LED-packages is arranged an array 206 of lenses. On top of the lens array 206 is arranged a collimating structure 210. The collimating structure comprises an array of collimators, comprising collimators 211 adapted to collimate light of the first property, collimators 212 adapted to collimate light of the second property and collimators 213 adapted to collimate light of the third property.

Each collimator 211, 212, 213 comprises a receiving area 221, 222, 223 and an output area 231, 232, 233, respectively, where the output area is bigger than the corresponding receiving area, and wherein each output area overlaps with at least one output area of an adjacent collimator.

The lens array 206 is arranged such that light from a first LED 201, 201', 201" is projected onto the receiving area of a collimator 211 adapted for collimating light of the first property, light from a second LED 202, 202', 202" is projected onto the receiving area of a collimator 212 adapted for collimating light of the second property, and light from a third LED 203, 203', 203" is projected onto the receiving area of a collimator 213 adapted for collimating light of the third property.

Due to the mirror symmetry in the device illustrated in FIG. 2, there is no need for reflecting walls extending from the substrate to the collimating structure, as was shown in FIG. 1 above. However, such reflecting walls may optionally be used in a device according to the embodiment in FIG. 2, for delimiting a LED-package or a group of LED-packages from an adjacent LED-package or group of LED-packages.

The person skilled in the art realizes that the present invention by no means is limited to the preferred embodiments described above. On the contrary, many modifications and variations are possible within the scope of the appended claims. For example, as is apparent from FIG. 2, in a device of the present invention, the light from one LED may be projected by the lens array onto more than one collimator, and one collimator may receive light from more than one LED.

Further, even if the lens array in FIG. 2 is illustrated as comprising one lens per LED-package, this is only for illustrative purposes, and it is not necessary that the number of lenses correspond to the number of LED-packages, as long as the lens system correctly projects the light from a LED onto the receiving area of a desired collimator.

In FIGS. 1 and 2 of the present application, the sidewalls of the collimators are illustrated as being flat. However, as is apparent to those skilled in the art, the sidewalls of the collimators may alternatively be curved, for example such as to form a parabolic-like shaped collimator. This might improve the collimating efficiency of the device.

The above-mentioned embodiments relate mainly to collimation and color mixing of light in the visible or near visible wavelength range (UV to IR). However, the brightness enhancing means of the present invention may also be for collimation of electromagnetic radiation outside this wavelength range, such as for example X-ray radiation, by choosing suitable dichroic filters.

As will be apparent to those skilled in the art, a light-emitting device of the present invention may comprise light sources of more than three colors, such as four or more colors, where light of each color is separately collimated in separate collimators, or where two or more colors are collimated in the same collimator.

Where applicable, certain surfaces, such as lens surfaces and surfaces on receiving and output areas may be provided with anti-reflection coatings, such as broad-band anti-reflection coatings or anti-reflection coatings specific for a certain light-property (a certain wavelength interval or a certain polarization).

Further, the receiving areas of the collimators may be provided with filters for selectively allowing passage of light into the collimators. For example, the receiving area of a collimator for collimating red light may be provided with a color filter that has a high transmission for red light (i.e. allowing passage of red light into the collimator) which it has a low transmission for blue and green light (by absorbing or reflecting green and blue light).

To summarize, the present invention relates to a light-emitting device comprising at least a first light source and a second light source is provided. The light source further comprises a first collimating means for collimating light from the first light-source and a second collimating means for collimating light from said second light source wherein the output areas of the collimating means at least partly overlaps. A light guiding means is arranged between said light sources and said collimating means for guiding light from the first light source to the first light collimating means, and from the second light source to the second collimating means.

A light-emitting device of the present invention can provide well mixed and collimated light even though there is a distance between the light sources and the collimating means.

The invention claimed is:

1. Light-emitting device, comprising
   (i) at least a first light source for emitting light of a first light property and a second light source for emitting light of a second light property, said first light property being different from said second light property,
   (ii) a first collimating means for collimating light of said first light property, said first collimating means comprising:
      (a) at least a first receiving area,
      (b) at least a first output area being larger than said first receiving area, and
      (c) first sidewalls at least partly connecting said first receiving area to said first output area, at least part of said first sidewalls comprising a first filter for reflecting light of said first light property;
   (iii) a second collimating means for collimating light of said second light property, said second collimating means comprising:
      (a) at least a second receiving area,
      (b) at least a second output area being larger than said second receiving area,
      (c) second sidewalls at least partly connecting said second receiving area to said second output area, at least part of said second sidewalls comprising a second filter for reflecting light of said second light property; wherein said first output area and said second output area at least partly overlaps, and
   (iv) a light guiding means arranged between said light sources and said collimating means for guiding light from said first light source to said at least one first receiving area, and guiding light from said second light source to said at least one second receiving area.

2. A light emitting device according to claim 1, wherein said light guiding means comprises at least one lens arranged between said light sources and said light collimating means.

3. A light emitting device according to claim 2, wherein said at least one lens comprises a telecentric lens system.

4. A light-emitting device according to claim 1, wherein said light guiding means comprises at least a first optical wave guide for guiding at least part of the light from said first light source to said at least one first receiving area, and at least a second optical wave guide for guiding at least part of the light from said second light source to said at least one second receiving area.

5. A light emitting device according to claim 4, wherein said first and/or second optical wave guide comprises at least one optical fiber.

6. A light emitting device according to claim 1, wherein said light guiding means comprises at least one mirror for guiding at least part of the light from said first light source to said to said at least one receiving area of said first light collimating means, and at least part of the light from said second light source to said at least one receiving area of said second light collimating means.

7. A light emitting device according to claim 1, wherein said first light property is a first wavelength interval and said first filter is a first dichroic filter; and wherein said second light property is a second wavelength interval and the second filter is a second dichroic filter.

8. A light emitting device according to claim 1, wherein said first light property is a first polarization state and said first filter is a first polarization filter; and wherein said second light property is a second polarization state and said second filter is a second polarization filter.

9. A light emitting device according to claim 1, wherein said first and second light sources each comprises at least one light emitting diode.

10. A light emitting device according to claim 1, wherein said light guiding means projects a first optical image of said first light source on said first receiving area, the area of said first optical image being smaller than the area of said first light source, and/or wherein the light guiding means projects a second optical image of said second light source on said second receiving area, and the area of said second optical image being smaller than the area of said second light source.

11. A light emitting device according to claim 1, wherein said first receiving area is smaller than the area of said first light source and/or wherein said second receiving area is smaller than the area of said second light source.

12. A light emitting device according to claim 1, wherein said first receiving area is provided with a filter which transmits light of said first light property and which reflects or absorbs light of said second light property.

* * * * *